United States Patent
Arell et al.

(10) Patent No.: US 6,580,321 B1
(45) Date of Patent: Jun. 17, 2003

(54) ACTIVE CLAMPING CIRCUIT FOR POWER AMPLIFIERS

(75) Inventors: Thomas William Arell, Basking Ridge, NJ (US); Henry Liwinski, North Wales, PA (US); Joel Morison Lott, Quakertown, PA (US); Osvaldo J. Lopez, Lebanon, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/939,183

(22) Filed: Aug. 24, 2001

(51) Int. Cl.$^7$ ................................................ H03F 3/04
(52) U.S. Cl. .................................... 330/207 P; 327/309
(58) Field of Search ............................. 330/207 P, 298; 327/309–323

(56) References Cited

U.S. PATENT DOCUMENTS

| | | | |
|---|---|---|---|
| 3,378,781 A | 4/1968 | Hill | 330/24 |
| 3,495,179 A | 2/1970 | Moss | 330/2 |
| 3,541,457 A | 11/1970 | Leighty et al. | 328/150 |
| 3,586,991 A | 6/1971 | Vosteen | 330/207 P |
| 3,611,174 A | 10/1971 | Day | 330/85 |
| 4,061,983 A | 12/1977 | Suzuki | 330/207 P |
| 4,077,014 A | 2/1978 | Satoh | 330/278 |
| 4,415,803 A | 11/1983 | Muoi | 250/214 A |
| 4,417,292 A * | 11/1983 | Borghese et al. | 330/207 P |
| 4,578,576 A | 3/1986 | Wheeler et al. | 250/214 A |
| 4,644,293 A * | 2/1987 | Kennett | 330/130 |
| 4,673,886 A * | 6/1987 | Bickley et al. | 330/145 |
| 4,683,443 A | 7/1987 | Young et al. | 330/277 |
| 5,015,839 A | 5/1991 | Tanikoshi | 250/214 AG |
| 5,136,257 A | 8/1992 | Reading | 330/129 |
| 5,257,285 A | 10/1993 | Thorp | 330/306 |
| 5,300,897 A | 4/1994 | Shiga et al. | 330/298 |
| 5,977,823 A | 11/1999 | Inoue et al. | 330/2 |
| 6,201,442 B1 * | 3/2001 | James et al. | 330/107 |

OTHER PUBLICATIONS

Yamamoto et al. "A 3.2–V Operation Single–Chip Dual–Band AlGaAs/GaAs HBT MMIC Power Amplifier with Active Feedback Circuit Technique", IEEE Journal of Solid–State Circuits, vol. 35, No. 8, Aug. 2000, pp. 1109–1120.

* cited by examiner

Primary Examiner—My-Trang Nu Ton
(74) Attorney, Agent, or Firm—Pennie & Edmonds LLP

(57) ABSTRACT

An active clamping circuit for a multi-stage power amplifier includes a feedback circuit which affects the gain of the amplifier. The feedback circuit feeds an output via a filter and a clamping transistor to an input of at least one stage of the power amplifier. The output fed to the filter and clamping transistor may be tapped from one or more diodes belonging to a diode stack connected to the power amplifier's output.

35 Claims, 4 Drawing Sheets

ACTIVE CLAMPING CIRCUIT FOR POWER AMPLIFIERS

FIELD OF THE INVENTION

The present invention relates generally to an active clamping circuit for power amplifiers and, more specifically, to an active clamping circuit for power amplifiers that reduces the gain of the amplifier when its output voltage becomes dangerously high, protecting the amplifier from damage.

BACKGROUND OF THE INVENTION

Power amplifiers such as those included in mobile phones may be subjected to extreme operating conditions which can lead to problems including amplifier failure. For example, if the impedance of the mobile phone antenna is mismatched to that of the amplifier circuit, Voltage Stand Wave Ratio (VSWR) and, thus, the voltage level at the output of the amplifier can increase to a dangerous level causing power amplifier failure and rendering the mobile phone useless.

To prevent amplifier failure, active control circuits may be added to the power amplifier that can adjust its gain to keep it within safe operating conditions. There are control circuits in the prior art that can control the gain of power amplifiers. However, many of them involve complex circuits which are expensive and take up valuable space on the integrated circuit or printed circuit board. In addition, some prior art control circuits target voltage breakdown-causing events occurring at the input of the power amplifier rather than at its output. Other prior art active control circuits are only geared towards improving the operating condition of the power amplifier, such as increasing its operational bandwidth or preventing it from reaching saturation rather than preventing power amplifier failure.

Therefore, there is a need for an improved active control circuit that is simple and compact and can prevent events occurring at the output of a power amplifier from causing its failure.

It is therefore an object of the present invention to provide an active clamping circuit that is simple and compact and can prevent failure of the amplifier.

It is another object of the present invention to provide an active clamping circuit that can prevent amplifier failure caused by signals transmitted from external sources to the amplifier output.

SUMMARY OF THE INVENTION

Briefly, the present invention provides an active clamping circuit that reduces the gain of a power amplifier when high voltages are present at its output stage. In a preferred embodiment, the active clamping circuit comprises a transistor with its base connected to a diode stack which is in turn connected to the output of the power amplifier. The diode stack may be of the type used previously for overvoltage protection in such devices and functions as a triggering circuit to trigger the active clamping circuit in overvoltage situations. The collector of the transistor is connected to a biasing circuit of the power amplifier that controls the latter's gain. During normal amplifier operation, the diode stack does not conduct and the active clamping circuit is off. However, when a high voltage signal is present at the output of the power amplifier, the diode stack conducts, switching on the active clamping circuit. The active clamping circuit, now switched on, reduces the bias level of the power amplifier, lowering its gain until the voltage level at the amplifier output is brought to a safe level. Optionally, an integrating filter is connected to the base of the transistor to fine tune the threshold level at which the clamping circuit becomes active.

DETAILED DESCRIPTION OF A PREFERRED EMBODIMENT

Figure 1:
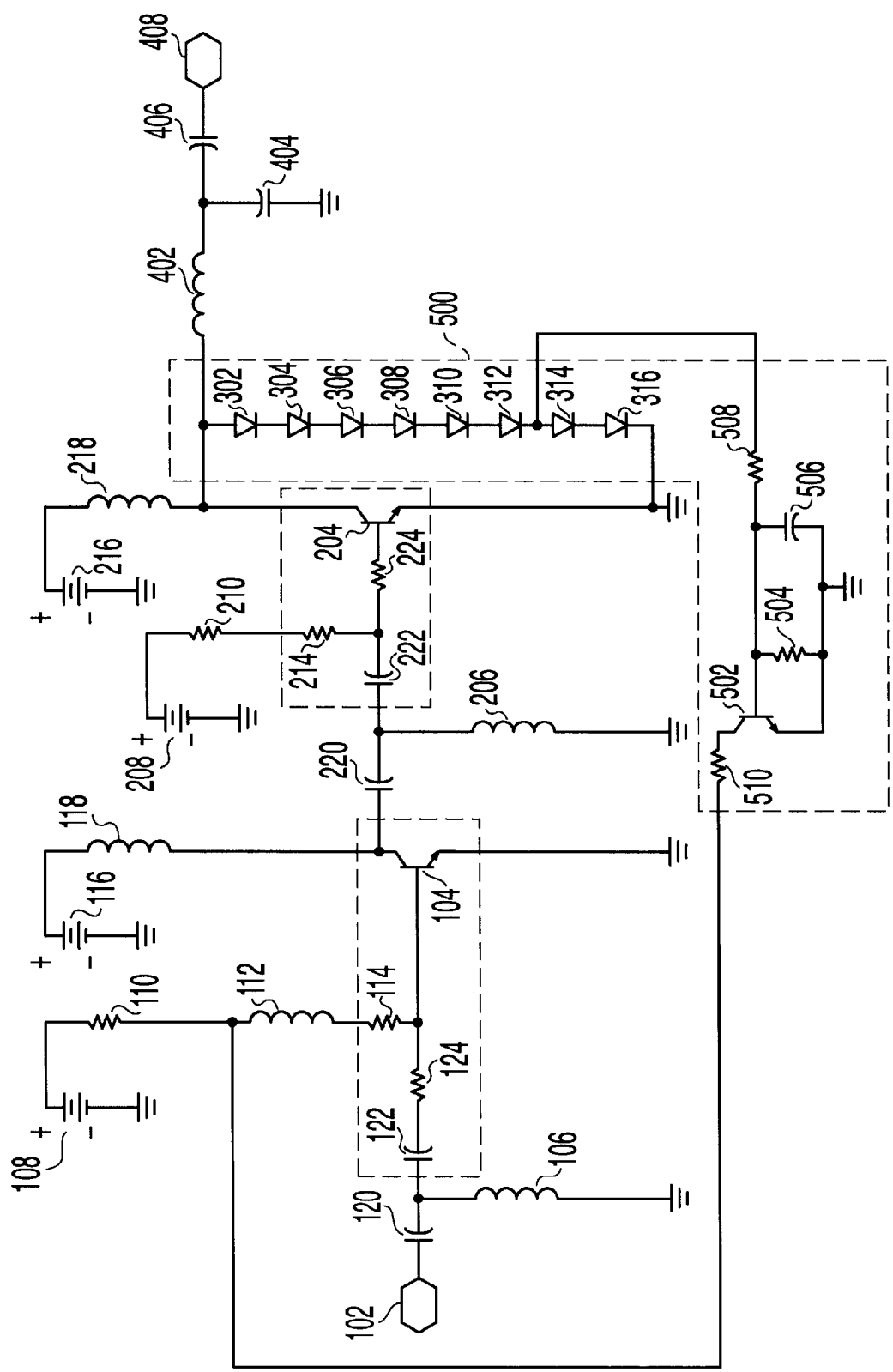
FIG. 1 is a schematic circuit diagram of a preferred embodiment of the active clamping circuit according to the invention shown connected to a two stage transistor-based power amplifier used in a mobile phone.

FIG. 1 illustrates an active clamping circuit 500 (located near the bottom of the page) in accordance with the present invention with circuit 500 shown connected to a Global System for Mobile telecommunication (GSM) 900 MHz power amplifier. Note that the GSM 900 MHz power amplifier is included merely as an example for demonstrating the operation of circuit 500 with mobile phone circuits, and that circuit 500 can work with any other power amplifier.

As depicted in the preferred embodiment of FIG. 1, active clamping circuit 500 includes a transistor 502, an intergrating filter formed by resistor 504 and capacitor 506, a base resistor 508, a collector resistor 510, and diode stack 302 to 316.

The base of transistor 502 is connected to the integrating filter (resistor 504 and capacitor 506). Values of resistor 504 and capacitor 506 are determined by the operating characteristics of the power amplifier such as the frequency range (s) of the signal being amplified, the modulation type, or the likely frequency range(s) of signals transmitted from external sources to the output of the power amplifier. Base resistor 508 and collector resistor 510 along with resistor 110 bias the base and collector of transistor 502, respectively, to place transistor 502 in the desired operating conditions. Base resistor 508 is, in turn, connected to diodes 314 and 316.

In FIG. 1, the power amplifier to which active clamping circuit 500 is connected is a two stage-amplifier. The first stage includes an input port 102 that connects a signal source (not shown) to the power amplifier. Specifically, input port 102 connects the signal source to an impedance matching circuit of the power amplifier circuit formed by capacitors 120 and 122 and inductor 106. The impedance matching circuit matches the output impedance of the signal source to the input impedance of the power amplifier circuit to achieve a good impedance match to the power amplifier. Capacitor 122 of the impedance matching circuit is, in turn, connected to resistor 124 which is, in turn, connected to the base of the first stage transistor 104 as well as to a base biasing circuit that biases the base of the transistor.

The base biasing circuit includes a voltage source 108, inductor 112, and resistors 110 and 114. Power source 108 supplies a bias that, together with resistors 110 and 114, bias the base of transistor 104 to establish the desired biasing conditions. Inductor 112, which has a high impedance for high frequency signals, along with resistor 114, prevents power source 108 from loading the signal to be amplified, ensuring the proper operation of the power amplifier. Resistor 510 of clamping circuit 500 is connected to the base biasing circuit at the junction of resistor 110 and inductor 112, allowing circuit 500 to alter the base biasing conditions and, thus, the power amplifier gain when needed as described in further detail below.

The collector of transistor 104 is connected to collector biasing circuit formed by power supply 116 and inductor 118, where power supply 116 outputs a DC signal to bias the collector of transistor 104 and inductor 118 isolates signal amplified by the first stage of the power amplifier at the collector from the power supply 116 to ensure the efficiency of the power amplifier.

The second stage of the power amplifier is connected to the collector of first stage transistor 104. Specifically, the collector is connected to the impedance matching circuit of the second stage formed by capacitors 220 and 222 and inductor 206. The impedance matching circuit matches the input impedance of the second stage to the output impedance of the first stage so that the signal transmitted to the second stage is not reflected back to the first stage, ensuring efficiency of the power amplifier.

The second stage impedance matching circuit is, in turn, connected to the second stage base biasing circuit formed by power supply 208 and resistors 210, 214 and 224 that establish the desired operating condition of the base of second stage transistor 204. The collector of second stage transistor 204 is connected to collector biasing circuit formed by power supply 216 and inductor 218. Power supply 216 biases the collector to establish the desired operating condition, and inductor 218 isolates power supply 216 from the amplified output signal to prevent the power supply from loading the output signal.

The amplified signal at the collector is presented across diode stack 302–316 and flows to an output impedance matching circuit formed by inductor 402 and capacitors 404 and 406 which matches the output impedance of the amplifier to the impedance of the antenna. Diodes 312 and 314 are, in turn, connected to active clamping circuit 500 via resistor 508 so that current is supplied to circuit 500 when the diodes are biased on. In an alternative embodiment, illustrated in FIG. 2, diode stack 302–316 is connected directly to he base of transistor 502 and not to a ground so that all the current conducted by the diode stack flows to the base.

In operation, the amplified signal at the collector of second stage transistor 204 normally does not exceed the voltage threshold of diode stack 302–316 and, therefore, does not activate circuit 500. However, the voltage at the collector of the second stage transistor 204 can increase to unusually high levels when a standing wave is established in the antenna under certain conditions, such as when the antenna is held near a conductor, such as the hood of a car, or a dielectric, such as when a hand picks up the phone by the antenna and changes the load impedance seen by the power amplifier.

The active clamping circuit 500 can prevent failure of the power amplifier circuit in the situation described above. Specifically, when the voltage at the collector of the second stage transistor 204 increases beyond the forward voltage threshold of diodes 302 to 316, the diodes are biased on, supplying current to the base of transistor 502 through integrating filter formed by resistors 504 and 508 and capacitor 506. The signal from the diodes charge capacitor 506 through resistor 508. When the voltage level at capacitor 506 reaches the forward base-emitter voltage, based current flows, activating the transistor. Note that the integrating filter is optional for the operation of circuit 500.

With transistor 502 switched on, its collector draws current away from the base of first stage transistor 104 through resistor 110, decreasing the gain of first stage transistor 104 and, thus, the overall gain of the power amplifier and reducing the voltage level at the collector of the second stage transistor 204.

Clamping circuit 500 continues to reduce the gain of the power amplifier until the voltage at the collector of second stage transistor 204 decreases to below the threshold voltage of diodes 302–316, at which point diodes 302–316 no longer conduct, cutting off power to clamping circuit 500. Circuit 500 remains inactive until another event occurs that raises the voltage at the collector of transistor 204 to unusually high levels.

Figure 2:
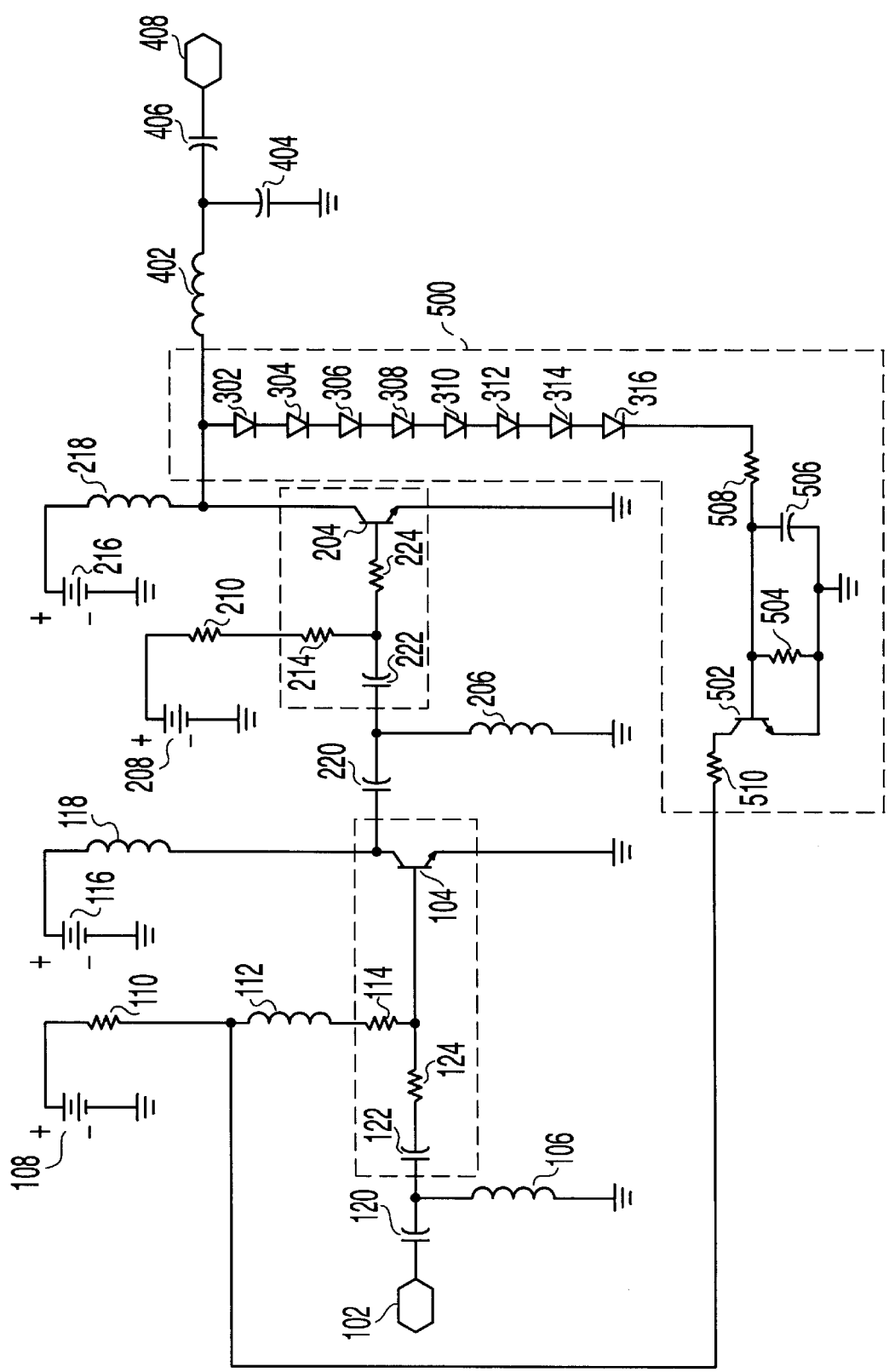
FIG. 2 is a schematic circuit diagram of an alternative embodiment of the active clamping circuit according to the invention shown connected to a two stage transistor-based power amplifier used in a mobile phone.
Figure 3:
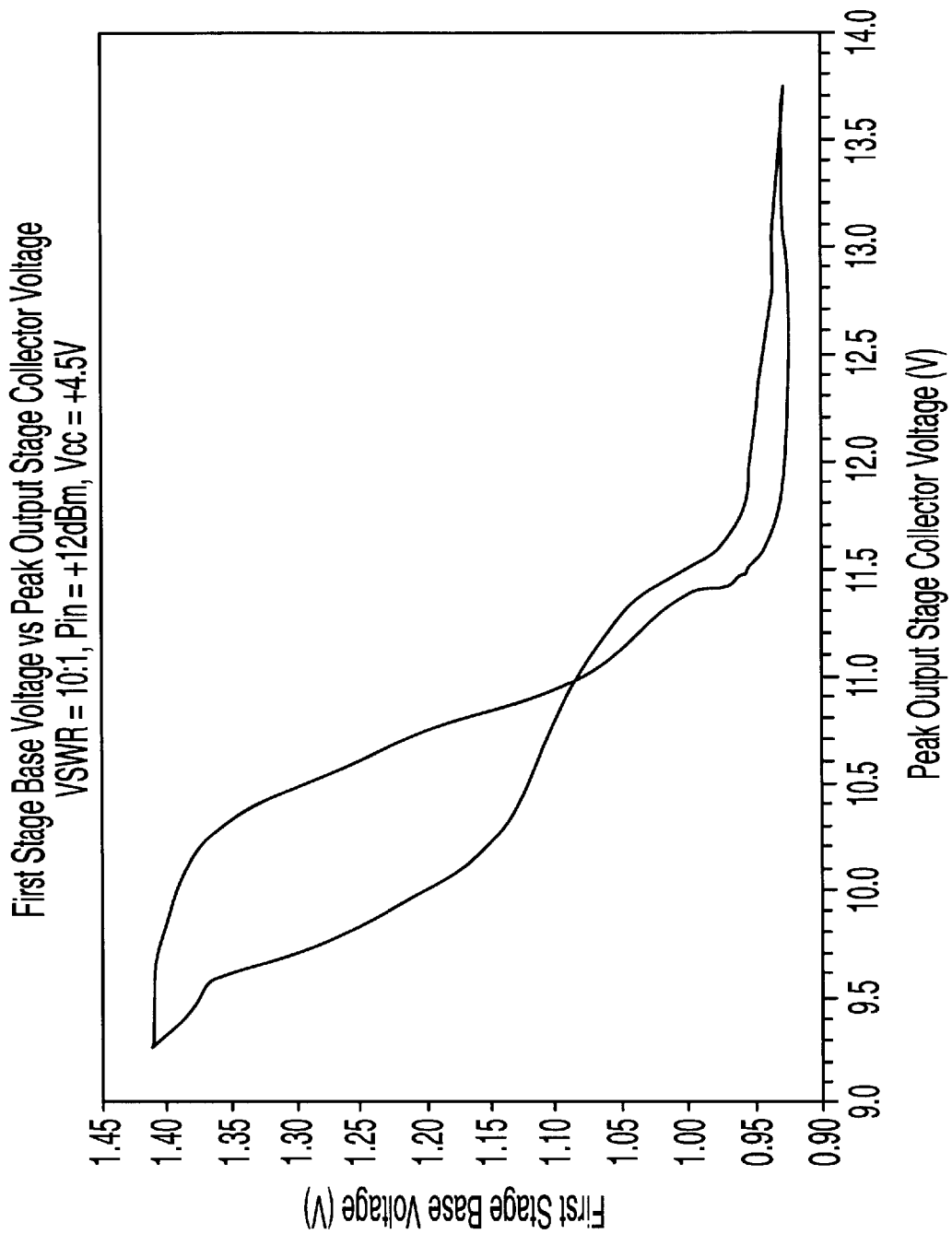
FIG. 3 is a graph of the peak output stage collector voltage vs. the first stage base voltage of the circuit shown in FIG. 2.
Figure 4:
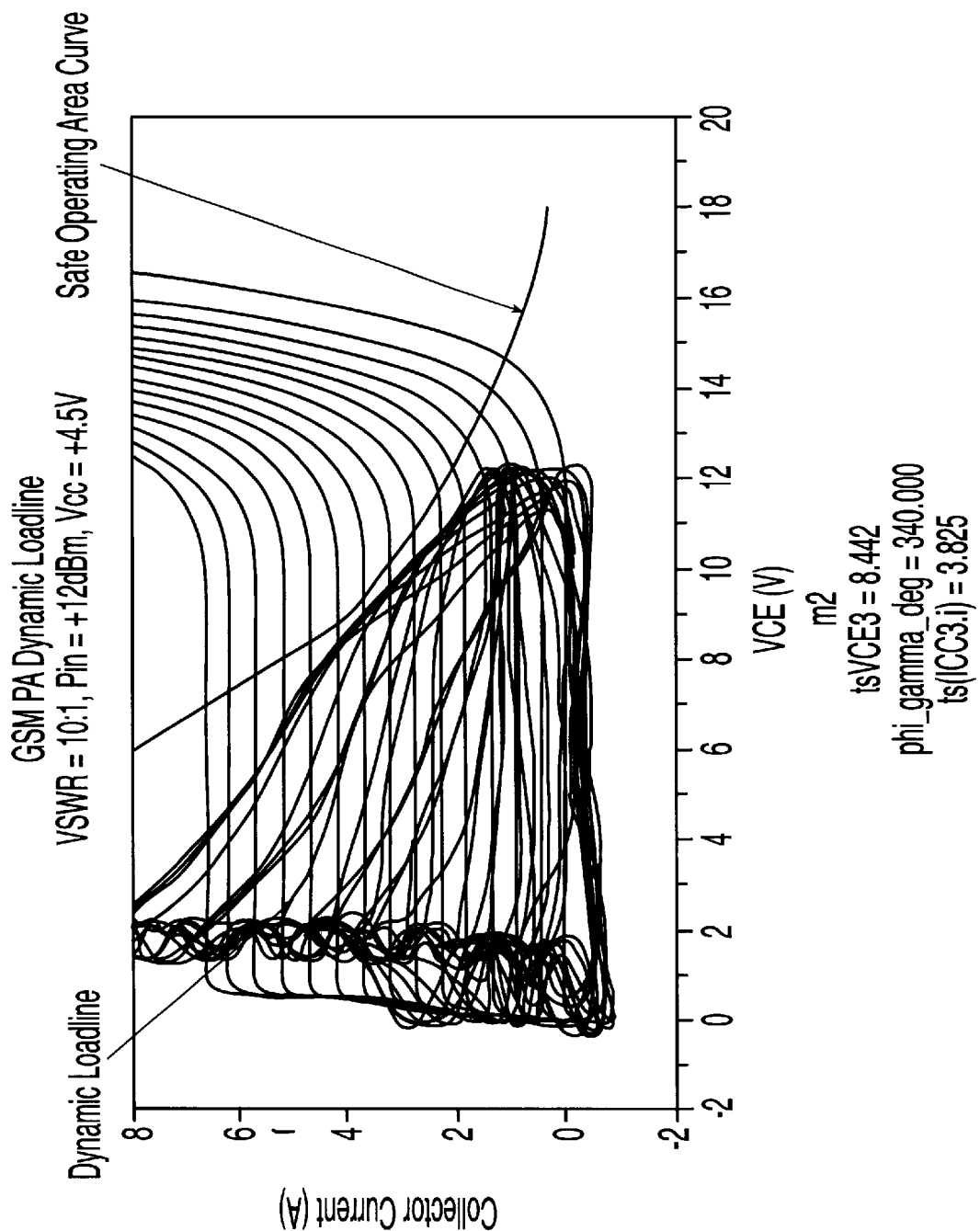
FIG. 4 is a graph of the dynamic load line of the power amplifier of FIG. 2 when its gain is clamped by the active clamping circuit.

FIG. 3 illustrates the effect of active clamping circuit 500 on the first stage base biasing conditions of the power amplifier of FIG. 1. As shown in the graph, when output stage collector voltage is high and active clamping circuit 500 is conducting strongly, the first stage base bias is drastically reduced. FIG. 4 illustrates the dynamic load line of the power amplifier of FIG. 2, showing that the collector current and voltage operate within the safe operating limit of transistor 204 as a result of clamping by circuit 500.

While the invention has been described in conjunction with specific embodiments, it is evident that numerous alternatives, modifications, and variations will be apparent to those skilled in the art in light of the forgoing description. For example, although the preferred embodiment describes the active clamping circuit in operation with a two stage transistor-based power amplifier, the active clamping circuit may also be modified to operate with other transistor-based power amplifiers with only one stage or more than two stages. In addition, if the power amplifier includes more than one amplifying stage, the active clamping circuit can be connected to the base biasing stage of any of the amplifying stages including the output stage itself. Furthermore, the active clamping circuit may also be modified to operate with FET-based power amplifiers. The scope of this invention encompasses all of these modifications and is defined by and intended to be limited only in accordance with the following claims.

What is claimed is:

1. An active clamping circuit in combination with a power amplifier comprising:
    a. the power amplifier comprising a biasing circuit that controls a gain of said power amplifier;
    b. a triggering circuit having an input connected to, and receiving an amplified signal from, an output of said power amplifier; and
    c. a clamping transistor, wherein the base of said clamping transistor is connected to, and receives a signal from, an output of said triggering circuit and the collector of said clamping transistor is connected to said biasing circuit of said power amplifier.

2. The active clamping circuit in combination with a power amplifier according to claim 1 further comprising a filter connected to the base of said clamping transistor, wherein said filter works with said triggering circuit to activate said clamping transistor.

3. The active clamping circuit in combination with a power amplifier according to claim 1 wherein said power amplifier is a transistor-based multi-stage power amplifier.

4. The active clamping circuit in combination with a power amplifier according to claim 1 wherein said clamping transistor reduces the gain of said power amplifier by reducing the base bias of one or more of the amplifying transistors of said power amplifier.

5. The active clamping circuit in combination with a power amplifier according to claim 1 wherein said triggering circuit is a diode stack.

6. A method for actively clamping a gain of a power amplifier which includes a biasing circuit that controls the amplifier's gain, comprising the steps of:
   a. detecting a high voltage signal at an output of the power amplifier; and
   b. activating a clamping circuit when the high voltage signal is detected in order to change the current in the biasing circuit to reduce the gain of the power amplifier.

7. The method according to claim 6, wherein the step of detecting is performed by a triggering circuit.

8. The method of claim 7, wherein the clamping circuit comprises a transistor with its base connected to the trigger circuit and its collector connected to the biased circuit of the power amplifier.

9. A power amplifier comprising:
   an amplifier circuit comprising:
      a first transistor having a first transistor input, the first transistor configured to amplify a first signal that is input to the power amplifier for amplification by the amplifier circuit;
      a first biasing circuit configured to apply a bias to said first transistor input; and
      a signal output for providing an amplified output signal, and
   a clamping circuit comprising:
      a clamping transistor connected to said first biasing circuit and configured to affect a gain of the amplifier circuit; and
      a triggering circuit configured to control said clamping transistor in response to a voltage level at said signal output, such that:
         when said signal output is at a first voltage, the triggering circuit does not turn on clamping transistor; and
         when said signal output is at a second voltage higher than said first voltage, the triggering circuit turns on said clamping transistor, thereby reducing a gain of said first transistor and thus the gain of the amplifier circuit.

10. The power amplifier according to claim 9, further comprising:
   an input port connected to the first transistor input; and
   an input impedance matching circuit connected between the input port and the first transistor input.

11. The power amplifier according to claim 10, further comprising an output impedance matching circuit connected to said signal output.

12. The power amplifier according to claim 9, further comprising a second transistor configured to further amplify a signal that has already been amplified by the first transistor, wherein the second transistor provides said amplified output signal at said signal output.

13. The power amplifier according to claim 9, further comprising a second transistor configured to amplify a second signal input thereto, wherein the first transistor is configured to amplify a signal that has already been amplified by the second transistor, and wherein the first amplifier provides said amplified output signal at said signal output.

14. The power amplifier according to claim 9, wherein:
   said first transistor comprises a first base, a first collector and a first emitter, and
   said first biasing circuit biases the first base of the first transistor.

15. The power amplifier according to claim 9, wherein:
   the first biasing circuit comprises a first power source supplying serially connected first and second resistors; and
   an output of the clamping transistor is connected to the first biasing circuit at a point between said serially connected first and second resistors.

16. The power amplifier according to claim 15, wherein:
   the first biasing circuit further comprises a first inductor connected between, and in series with, the first and second resistors; and
   the output of the clamping transistor is connected to the first biasing circuit at a point between said first resistor and said first inductor.

17. The power amplifier according to claim 9, wherein:
   the first biasing circuit comprises a first power source supplying a first resistor connected in series with a first inductor; and
   an output of the clamping transistor is connected to the first biasing circuit at a point between said first resistor and said first inductor.

18. The power amplifier according to claim 9, wherein:
   the triggering circuit comprises a diode stack having a first plurality of diodes connected together in series and configured to be biased on, when said signal output is at said second voltage;
   an output of one of said first plurality of diodes is electrically connected to an input of the clamping transistor; and
   the clamping transistor is turned on, when said first plurality of diodes are biased on.

19. The power amplifier according to claim 18, wherein said first plurality of diodes comprises at least three diodes.

20. The power amplifier according to claim 18, wherein:
   the diode stack further comprises one or more additional diodes connected in series with said first plurality of diodes, an input of a first of said additional diodes being connected to said output of one of said first plurality of diodes and also being connected to said input of said clamping transistor.

21. The power amplifier according to claim 20, wherein said one or more additional diodes includes a diode having an output that is grounded.

22. The power amplifier according to claim 9, wherein:
   the clamping transistor comprises a base, a collector and an emitter;
   the base of the clamping transistor receives an input from said triggering circuit;
   the collector of the clamping transistor is connected to the first biasing circuit; and
   the clamping transistor is turned on, when said signal output is at said second voltage.

23. The power amplifier according to claim 22, further comprising an integrating filter configured to filter a signal applied to the base of the clamping transistor.

24. The power amplifier according to claim 9, further comprising:
a second transistor configured to further amplify a signal that has already been amplified by the first transistor, wherein the second transistor provides said amplified output signal at said signal output;
and wherein:
the first biasing circuit comprises a first power source supplying serially connected first and second resistors;
an output of the clamping transistor is connected to the first biasing circuit at a point between said serially connected first and second resistors;
the triggering circuit comprises a diode stack having a first plurality of diodes connected together in series and configured to be biased on, when said signal output is at said second voltage;
an output of one of said first plurality of diodes is electrically connected to an input of the clamping transistor; and
the clamping transistor is turned on, when said first plurality of diodes are biased on.

25. The power amplifier according to claim 24, further comprising:
an input port connected to the first transistor input;
an input impedance matching circuit connected between the input port and the first transistor input; and
an output input impedance matching circuit connected to said signal output.

26. The power amplifier according to claim 24, wherein:
the first biasing circuit further comprises a first inductor connected between, and in series with, the first and second resistors; and
the output of the clamping transistor is connected to the first biasing circuit at a point between said first resistor and said first inductor.

27. The power amplifier according to claim 24, wherein:
the first transistor comprises a first base, a first collector and a first emitter, and
the first biasing circuit biases the first base of the first transistor.

28. The power amplifier according to claim 24, wherein:
said first plurality of diodes comprises at least three diodes.

29. The power amplifier according to claim 28, wherein:
the diode stack further comprises one or more additional diodes connected in series with said first plurality of diodes, an input of a first of said additional diodes being connected to said output of one of said first plurality of diodes and also being connected to said input of said clamping transistor.

30. The power amplifier according to claim 29, wherein said one or more additional diodes includes a diode having an output that is grounded.

31. The power amplifier according to claim 24, wherein:
the clamping transistor comprises a base, a collector and an emitter;
the collector of the clamping transistor is connected to the first biasing circuit; and
the clamping transistor is turned on, when said signal output is at said second voltage.

32. The power amplifier according to claim 31, further comprising an integrating filter configured to filter a signal applied to the base of the clamping transistor.

33. A method for reducing a gain of a power amplifier configured to receive an input signal and create an amplified signal therefrom, said power amplifier having cascaded first and second amplifier stages wherein the second amplifier stage is configured to amplify a signal received from the first amplifier stage, the first and second amplifier stages both contributing to the gain of the power amplifier, the method comprising:
detecting an excessive voltage condition in said amplified signal;
in response to detecting said excessive voltage condition, activating a clamping transistor to thereby change a bias applied to a first transistor belonging to one of said cascaded first and second amplifier stages, such that a signal gain of said first transistor, and thus the amplifier stage to which said transistor belongs, is reduced, said clamping transistor being separate and distinct from said first transistor.

34. The method according to claim 33, comprising reducing the bias applied to said transistor.

35. A method for reducing a gain of a power amplifier configured to receive an input signal and create an amplified signal therefrom, said power amplifier having cascaded first and second amplifier stages wherein the second amplifier stage is configured to amplify a signal received from the first amplifier stage, the first and second amplifier stages both contributing to the gain of the power amplifier, the method comprising:
detecting an excessive voltage condition in said amplified signal;
in response to detecting said excessive voltage condition, activating a clamping transistor to thereby change a current in a biasing circuit that applies a bias to a first transistor belonging to one of said cascaded first and second amplifier stages, such that a signal gain of said first transistor, and thus the amplifier stage to which said transistor belongs, is reduced, said clamping transistor being separate and distinct from said first transistor.

* * * * *